(12) United States Patent
Wu et al.

(10) Patent No.: US 10,903,136 B2
(45) Date of Patent: Jan. 26, 2021

(54) PACKAGE STRUCTURE HAVING A PLURALITY OF INSULATING LAYERS

(71) Applicant: TDK TAIWAN CORP., Taoyuan (TW)

(72) Inventors: Ming-Hung Wu, Taoyuan (TW); Chi-Fu Wu, Taoyuan (TW); An-Ping Tseng, Taoyuan (TW); Hao-Yu Wu, Taoyuan (TW)

(73) Assignee: TDK Taiwan Corp., Taoyuan (TW)

( * ) Notice: Subject to any disclaimer, the term of this patent is extended or adjusted under 35 U.S.C. 154(b) by 0 days.

(21) Appl. No.: 16/183,128

(22) Filed: Nov. 7, 2018

(65) Prior Publication Data

US 2019/0139860 A1 May 9, 2019

Related U.S. Application Data

(60) Provisional application No. 62/582,591, filed on Nov. 7, 2017.

(30) Foreign Application Priority Data

Oct. 24, 2018 (CN) ...................... 2018 2 1729019 U

(51) Int. Cl.
*H01L 23/12* (2006.01)
*H01L 23/48* (2006.01)
(Continued)

(52) U.S. Cl.
CPC ........ *H01L 23/3735* (2013.01); *H01L 21/486* (2013.01); *H01L 21/76804* (2013.01); *H01L 21/76877* (2013.01); *H01L 23/367* (2013.01); *H01L 23/3677* (2013.01); *H01L 23/481* (2013.01); *H01L 23/49822* (2013.01);
(Continued)

(58) Field of Classification Search
CPC . H01L 23/3735; H01L 23/367; H01L 23/226; H01L 21/49827; H01L 23/49822; H01L 23/481; H01L 23/5386; H01L 23/5384; H01L 23/528; H01L 21/76804;
(Continued)

(56) References Cited

U.S. PATENT DOCUMENTS 6,734,542 B2 * 5/2004 Nakatani ............. H01L 21/4857
257/687
7,053,475 B2 * 5/2006 Akagawa ................ H01L 24/97
257/686

(Continued)

FOREIGN PATENT DOCUMENTS

| JP | 2008166511 A | 7/2008 |
|---|---|---|
| JP | 2010080866 A | 4/2010 |
| JP | 2010087266 A | 4/2010 |

*Primary Examiner* — Alonzo Chambliss
(74) *Attorney, Agent, or Firm* — Muncy, Geissler, Olds & Lowe, P.C.

(57) ABSTRACT

A package structure is provided, including a first insulating layer, a second insulating layer, a third insulating layer, and a chip. The second insulating layer is disposed on the first insulating layer, the chip is disposed in the second insulating layer, and the third insulating layer is disposed on the second insulating layer. The heat conductivity of the second insulating layer is lower than the heat conductivity of the first insulating layer, and the hardness of the second insulating layer is lower than the hardness of the first insulating layer.

19 Claims, 16 Drawing Sheets

(51) Int. Cl.
*H01L 21/4763* (2006.01)
*H01L 23/373* (2006.01)
*H01L 23/367* (2006.01)
*H01L 23/522* (2006.01)
*H01L 23/532* (2006.01)
*H01L 23/538* (2006.01)
*H01L 21/768* (2006.01)
*H01L 23/498* (2006.01)
*H01L 23/528* (2006.01)
*H01L 21/48* (2006.01)
*H01L 23/00* (2006.01)

(52) U.S. Cl.
CPC ........ *H01L 23/528* (2013.01); *H01L 23/5226* (2013.01); *H01L 23/5384* (2013.01); *H01L 23/5386* (2013.01); *H01L 23/5389* (2013.01); *H01L 23/53295* (2013.01); *H01L 24/82* (2013.01); *H01L 2224/18* (2013.01)

(58) Field of Classification Search
CPC ... H01L 23/5226; H01L 21/486; H01L 24/82; H01L 21/76877
See application file for complete search history.

(56) References Cited

U.S. PATENT DOCUMENTS

| | | | |
|---|---|---|---|
| 7,319,049 B2* | 1/2008 | Oi | H01L 21/4857 257/686 |
| 7,508,006 B2* | 3/2009 | Hsu | H01L 23/48 257/432 |
| 2002/0011351 A1* | 1/2002 | Ogawa | H01L 21/4803 174/260 |
| 2009/0224391 A1* | 9/2009 | Lin | H01L 21/6835 257/690 |
| 2010/0052135 A1* | 3/2010 | Shim | H01L 21/568 257/686 |
| 2012/0056321 A1* | 3/2012 | Pagaila | H01L 25/105 257/737 |
| 2012/0119379 A1* | 5/2012 | Koizumi | H01L 23/5389 257/774 |
| 2012/0133052 A1* | 5/2012 | Kikuchi | H01L 23/49827 257/774 |
| 2012/0153493 A1* | 6/2012 | Lee | H01L 25/16 257/774 |
| 2013/0187178 A1* | 7/2013 | Tischler | H01L 27/14 257/88 |
| 2016/0027764 A1* | 1/2016 | Kim | H01L 24/97 257/686 |

* cited by examiner

PACKAGE STRUCTURE HAVING A PLURALITY OF INSULATING LAYERS

CROSS-REFERENCE TO RELATED APPLICATIONS

The present application claims priority to U.S. Provisional Patent Application No. 62/582,591, filed on Nov. 7, 2017, and China Patent Application No. 201821729019.X filed on Oct. 24, 2018, which are incorporated by reference herein in their entirety.

BACKGROUND OF THE INVENTION

Field of the Invention

The invention relates to a package structure, and more particularly to a package structure with an improved heat dissipation function.

Description of the Related Art

The semiconductor integrated circuit (IC) industry has experienced exponential growth. Technological advances in IC materials and design have produced generations of ICs where each generation has smaller and more complex circuits than the previous generation, and the ICs are applied in the devices in daily life (e.g. cell phones, transformers, batteries, cars, etc.). In order to further enhance the efficiency of the IC devices, various miniaturization methods for enhancing manufacturing efficiency and reducing the cost are desired in the industry. For example, a substrate occupies a certain amount of space in a cell phone, so the remaining space available for other elements (e.g. batteries) is limited. If the space occupied by the substrate can be reduced, the additional space may be utilized flexibly to meet the user's needs.

Various package structures are utilized when trying to reduce the dimensions of the substrate. For a package structure in a device which requires greater current, and which produces more heat, the accumulation of the heat may reduce the efficiency of the device or even damage the device. As a result, how to provide an improved heat dissipation function for the package device has become an important issue.

BRIEF SUMMARY OF THE INVENTION

A package structure is provided in the present invention, which includes a first insulating layer, a second insulating layer disposed on the first insulating layer, a chip disposed in the second insulating layer, and a third insulating layer disposed on the second insulating layer, wherein the heat conductivity of the second insulating layer is lower than the heat conductivity of the first insulating layer, and the hardness of the second insulating layer is lower than the hardness of the first insulating layer.

Regarding the package structure provided in some embodiments of the present invention, the material of the first insulating layer includes ceramic, and the material of the second insulating layer includes resin. The material of the second insulating layer does not include glass fiber. The heat conductivity of the second insulating layer is lower than the heat conductivity of the third insulating layer, and the hardness of the second insulating layer is lower than the hardness of the third insulating layer. The material of the third insulating layer includes ceramic.

Regarding the package structure provided in some embodiments of the present invention, the third insulating layer includes a metal layer and an insulating film disposed on the metal layer. The package structure further includes a resilient layer and an electronic device disposed on the first insulating layer. The heat conductivity of the first insulating layer is lower than the heat conductivity of the third insulating layer, and the hardness of the first insulating layer is lower than the hardness of the third insulating layer. The thickness of a ceramic material in the first insulating layer is greater than 50% of the thickness of the first insulating layer. The thickness of the second insulating layer is greater than the thickness of the first insulating layer and the thickness of the third insulating layer, and the thickness of the third insulating layer is greater than the thickness of the first insulating layer.

Regarding the package structure provided in some embodiments of the present invention, the first insulating layer includes a metal layer and a first insulating film disposed on the metal layer, and the second insulating layer includes resin. The third insulating layer includes ceramic. The third insulating layer includes a metal layer and a second insulating film. The metal layer of the first insulating layer includes a conductive portion and an insulating portion electrically isolated from the conductive portion. The second insulating layer does not overlap the first insulating layer or the third insulating layer when viewed from a direction parallel to an interface between the first insulating layer and the second insulating layer. The package structure further includes a first wiring layer, a second wiring layer and a plurality of vias, wherein the first wiring layer is disposed between the first insulating layer and the second insulating layer, the second wiring layer is disposed between the second insulating layer and the third insulating layer, and the vias are electrically connected to the chip, the first wiring layer and the second wiring layer.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
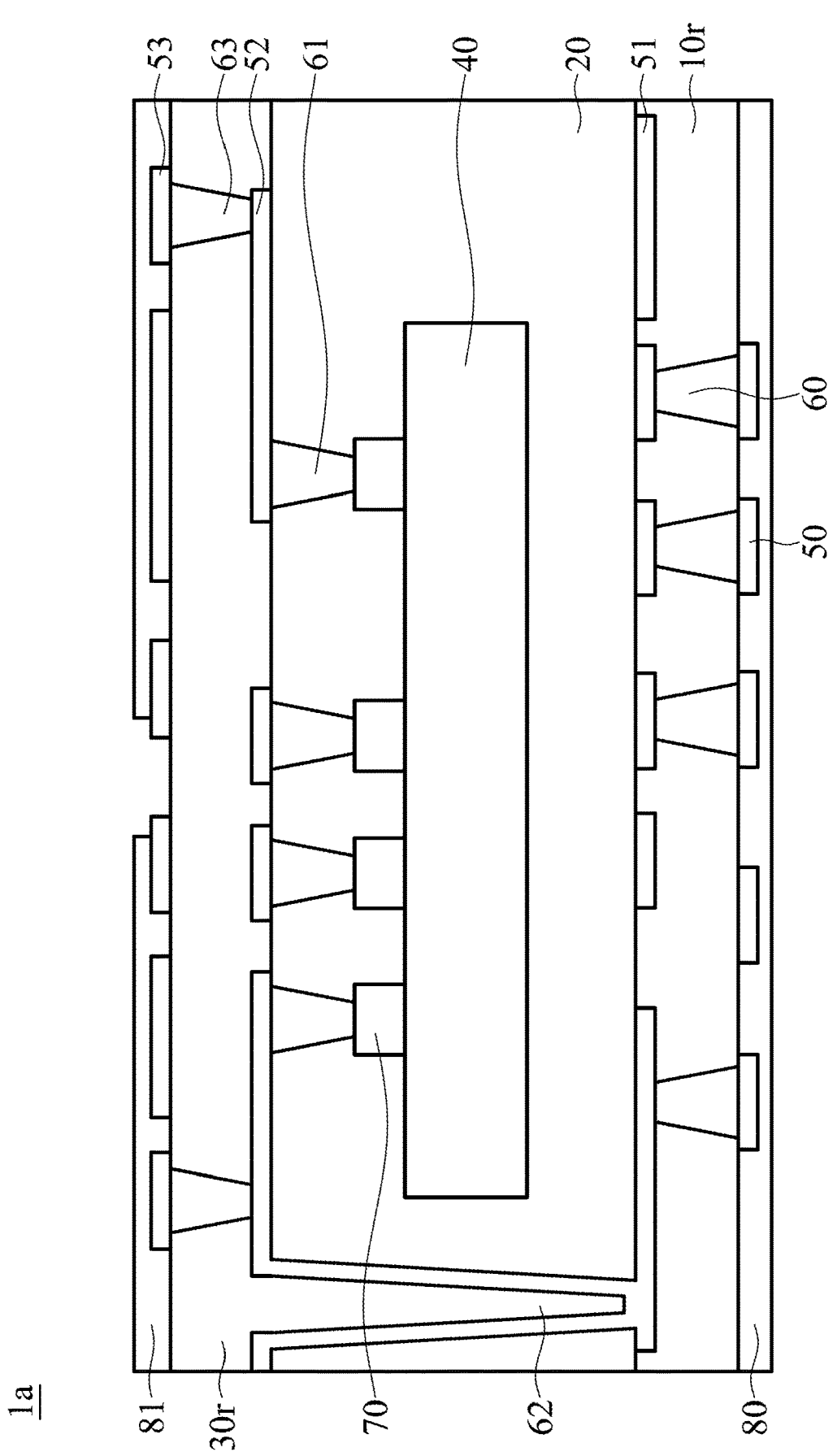
FIG. 1A is a cross-sectional view of a package structure of an embodiment.

The present disclosure provides many different embodiments, or examples, for implementing different features of this disclosure. Specific examples of components and arrangements are described below to simplify the present disclosure. These are, of course, merely examples and are not intended to be limiting.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "at below", "lower", "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

A package structure 1a of an embodiment is illustrated in FIG. 1A. The package structure 1a mainly includes a first insulating layer 10r, a second insulating layer 20, a third insulating layer 30r, a chip 40 and interconnection structures for providing electrical conduction between the chip 40 and other elements outside. The first insulating layer 10r is disposed on the second insulating layer 20, the second insulating layer 20 is disposed on the third insulating layer 30r, and the chip 40 is disposed in the second insulating layer 20.

The interconnection structures include a wiring layer 50 disposed on the first insulating layer 10r, a wiring layer 51 disposed between the first insulating layer 10r and the second insulating layer 20, a wiring layer 52 disposed between the second insulating layer 20 and the third insulating layer 30r, a wiring layer 53 disposed on the third insulating layer 30r, vias 60 disposed in the first insulating layer 10r, vias 61 and 62 disposed in the second insulating layer 20, and vias 63 disposed in the third insulating layer 30r. Conductive pads 70 are disposed between the chip 40 and the vias 61. Passivation layers 80 and 81 are disposed on surfaces of the first insulating layer 10r and the third insulating layer 30r facing the outside of the package structure 1a, and cover a portion of the wiring layers 50 and 53, respectively.

Furthermore, a suitable pressing process (e.g. hot pressing process) may be used after forming the second insulating layer 20, wherein the pressing process is used for combining the first insulating layer 10r and the third insulating layer 30r with the second insulating layer 20, and thus forms the package structure 1a.

In the interconnection structure, the vias 60 are electrically connected to the wiring layers 50 and 51, the vias 61 are electrically connected to the wiring layer 52 and to the chip 40 through the conductive pad 70, the vias 62 are electrically connected to the wiring layers 51 and 52, and the vias 63 are electrically connected to the wiring layers 52 and 53. It should be realized that the positions of the wiring layers 50, 51, 52 and 53 and the positions of the vias 60, 61, 62 and 63 are merely exemplary, and the actual configuration of them may be modified, depending on designing and manufacturing requirements. Although the vias 60, 61, 62 and 63 are illustrated as having a trapezoid shape, the present invention is not limited thereto. For example, suitable processes (e.g. drilling process) may be applied to obtain a via having a straight sidewall. Furthermore, although an interface is illustrated between the wiring layer and the vias in FIG. 1A, it is just an example. Suitable processes may be applied to prevent an apparent interface formed between the wiring layer and the vias. The wiring layers 50, 51, 52 and 53 may be formed by, for example, laser wire bonding.

The wiring layers 50, 51, 52 and 53 and the vias 60, 61, 62 and 63 may include suitable conductive materials, such as W, Al, Co or Cu, etc. A person with ordinary skill in the art will realize that other conductive materials for the wiring layers 50, 51, 52 and 53 and vias 60, 61, 62 and 63 are included in the scope and the spirit of the present embodiment.

The passivation layers 80 and 81 are used for protecting the elements in the package structure 1a, and multiple openings are formed on the passivation layers 80 and 81 to expose a portion of the wiring layers 50 and 53. As a result, the package structure 1a is allowed to be electrically connected to the circuits outside. In some embodiments, the passivation layers 80 and 81 are formed by silicon oxide, silicon nitride, silicon oxynitride or a combination thereof. In some embodiments, the passivation layers 80 and 81 are formed by polymers. In some embodiments, the passivation layers 80 and 81 are formed by chemical vapor deposition (CVD) process, spin-on coating process, sputtering process, or a combination thereof.

The materials of the first insulating layer 10r and the third insulating layer 30r may be identical or similar resin materials, such as FR-4 or Bismaleimide Triazine (BT), etc. The material of the second insulating layer 20 may be different to the material of the first insulating layer 10r and the third insulating layer 30r, such as a resin material having higher heat conductivity than the heat conductivity of the first insulating layer 10r and the heat conductivity of the third insulating layer 30r. Furthermore, no glass fiber is required for the second insulating layer 20, so the manufacturing cost may be reduced, and the process may be simplified. However, if both of the first insulating layer 10r and the third insulating layer 30r are formed by resin materials having lower heat conductivity (e.g. <2 W/mK), the heat generated by the elements in the package structure 1a (e.g. the chip 40 or other elements) during operation may be harder dissipated from the package structure 1a, the temperature of the package structure 1a may be increased, and the performance may therefore be limited.

Figure 1B:
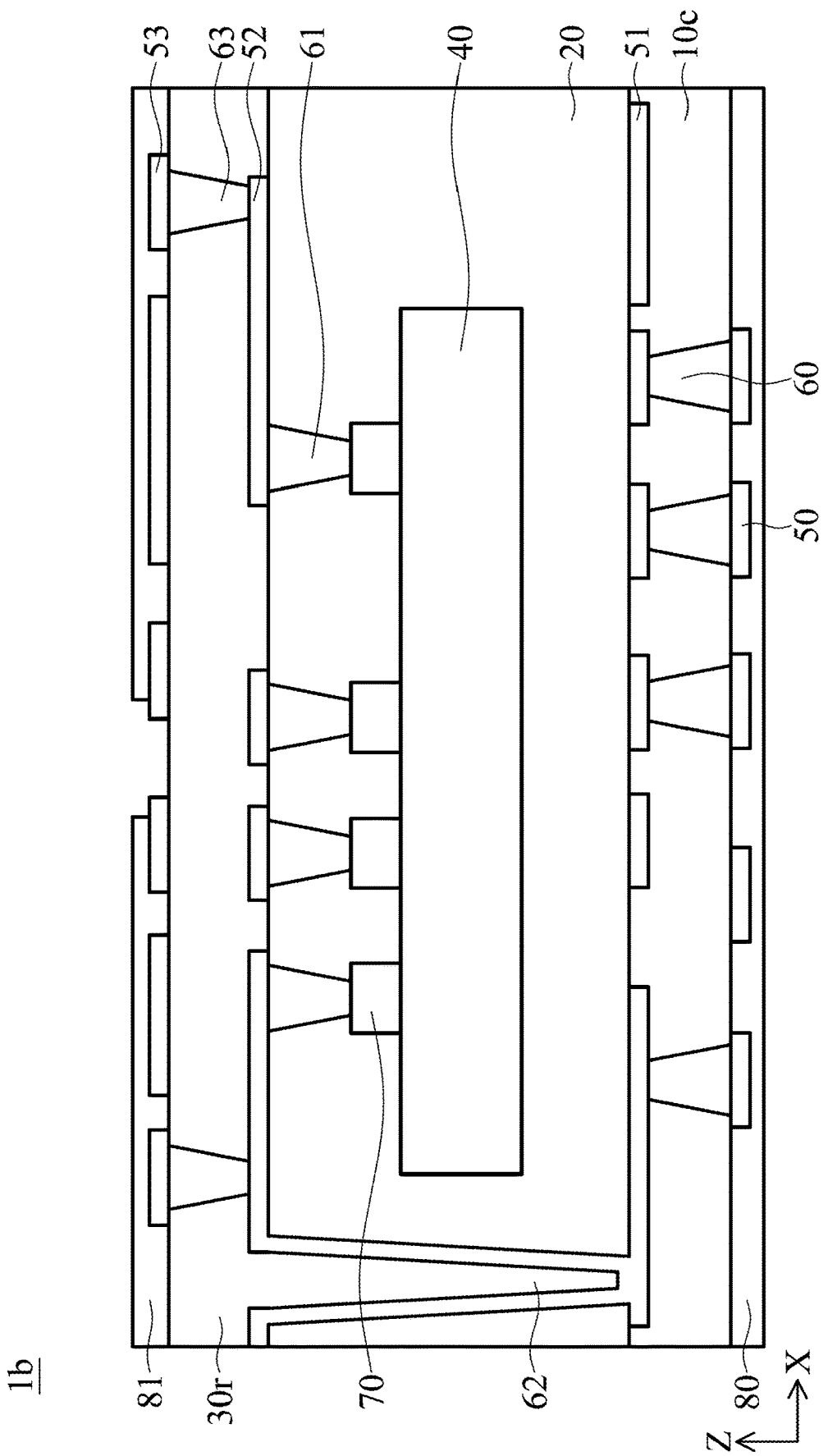
FIG. 1B is a cross-sectional view of a package structure of an embodiment of the present invention.

A package structure 1b of another embodiment of the present invention is illustrated in FIG. 1B. The package structure 1b is similar to the package structure 1a, the difference between the package structures 1a and 1b is that the first insulating layer 10c of the package structure 10b is different from the first insulating layer 10r of the package structure 1a, and details of other identical or similar elements are not repeated herein.

In this embodiment, the first insulating layer 10c is formed from a ceramic material having higher heat conductivity than the heat conductivity of the first insulating layer 10r, such as aluminum oxide or aluminum nitride, etc. The heat conductivity of the first insulating layer 10c may be, for example, greater than 20 W/mK. In this configuration, the heat generated by the chip 40 in the package structure 1b may be dissipated to the outside at a faster rate than the package structure without the first insulating layer 10c made of ceramic, and therefore the performance of the package structure 1b may be enhanced. Furthermore, the heat dissipation direction may be controlled as well. Moreover, the first insulating layer 10c made of ceramic is harder to deform and has a higher hardness than the first insulating layer 10r made of resin, so the reliability of the connection between these elements may be enhanced. The first insulating layer 10c has a rougher surface than the first insulating layer 10r, so the bonding strength between the first insulating layer 10c and the second insulating layer 20 may be increased after the first insulating layer 10c being bonded with the second insulating layer 20 made of resin.

It should be noted that the thickness of the ceramic material in the first insulating layer 10c is greater than 50% of the total thickness of the first insulating layer 10c, and therefore ensuring the first insulating layer 10c includes adequate ceramic material to achieve the advantages mentioned above. Furthermore, when viewed along the X direction in FIG. 1B (a direction parallel to an interface between the first insulating layer 10c and the second insulating layer 20), the first insulating layer 10c and the second insulating layer 20 of the package structure 1b do not overlap each other, and the second insulating layer 20 and the third insulating layer 30r do not overlap each other. In this configuration, the manufacturing process of the package structure 1b may be simplified, and the cost may therefore be reduced. Moreover, when viewed along the Z direction in FIG. 1B (a direction perpendicular to the interface between the first insulating layer 10c and the second insulating layer 20), at least a portion of the first insulating layer 10c and at least a portion of the third insulating layer 30r may be overlapped with the chip 40, so the heat conduction along the Z direction may be further improved.

Furthermore, the first insulating layer 10c and the second insulating layer 20 are formed in different steps, and then are combined by suitable processes (e.g. hot pressing process) to prevent the chip 40 in the second insulating layer 20 and the second insulating layer 20 itself being damaged during the process forming the first insulating layer 10c.

Figure 1C:
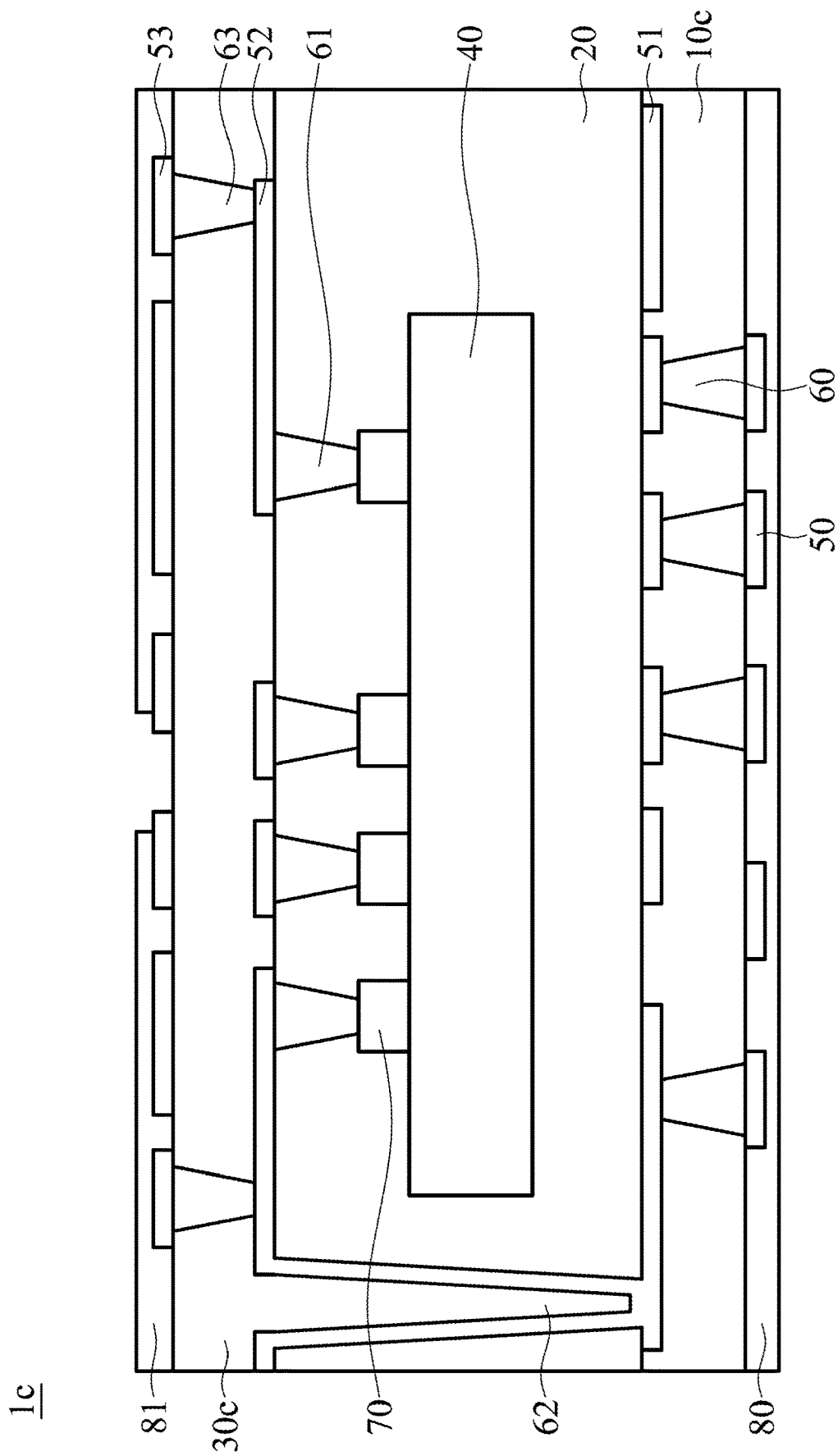
FIG. 1C is a cross-sectional view of another package structure of an embodiment of the present invention.

A package structure 1c of another embodiment of the present invention is illustrated in FIG. 1C. The package structure 1c is similar to the package structure 1a, the difference between them is that the first insulating layer 10c and the third insulating layer 30c of the package structure 1c are different from the first insulating layer 10r and the third insulating layer 30r of the package structure 1a, and the descriptions of other identical or similar elements are not repeated herein. In this embodiment, the first insulating layer 10c and the third insulating layer 30c are formed from ceramic material having higher heat conductivity than the heat conductivities of the first insulating layer 10r and the third insulating layer 30r, such as aluminum oxide or aluminum nitride, etc. As a result, the heat generated by the chip 40 may be further dissipated to prevent the temperature of the package structure 10c becoming too high, and the performance of the package structure 1c may therefore be enhanced. Furthermore, the heat dissipation direction may be controlled in this manner. Moreover, the first insulating layer 10c and the third insulating layer 30c made of ceramic have higher hardness and harder to be deformed than the first insulating layer 10r and the third insulating layer 30r made of resin, so the problem of warpage of the package structure 1c may be prevented to enhance the reliability of the connection. Furthermore, the first insulating layer 10c and the third insulating layer 30c has rougher surfaces than the first insulating layer 10r and the third insulating layer 30r, so the bonding strength between the first insulating layer 10c and the second insulating layer 20 and the bonding strength between the third insulating layer 30c and the second insulating layer 20 may be increased after being bonded with the second insulating layer 20 made of resin.

Figure 1D:
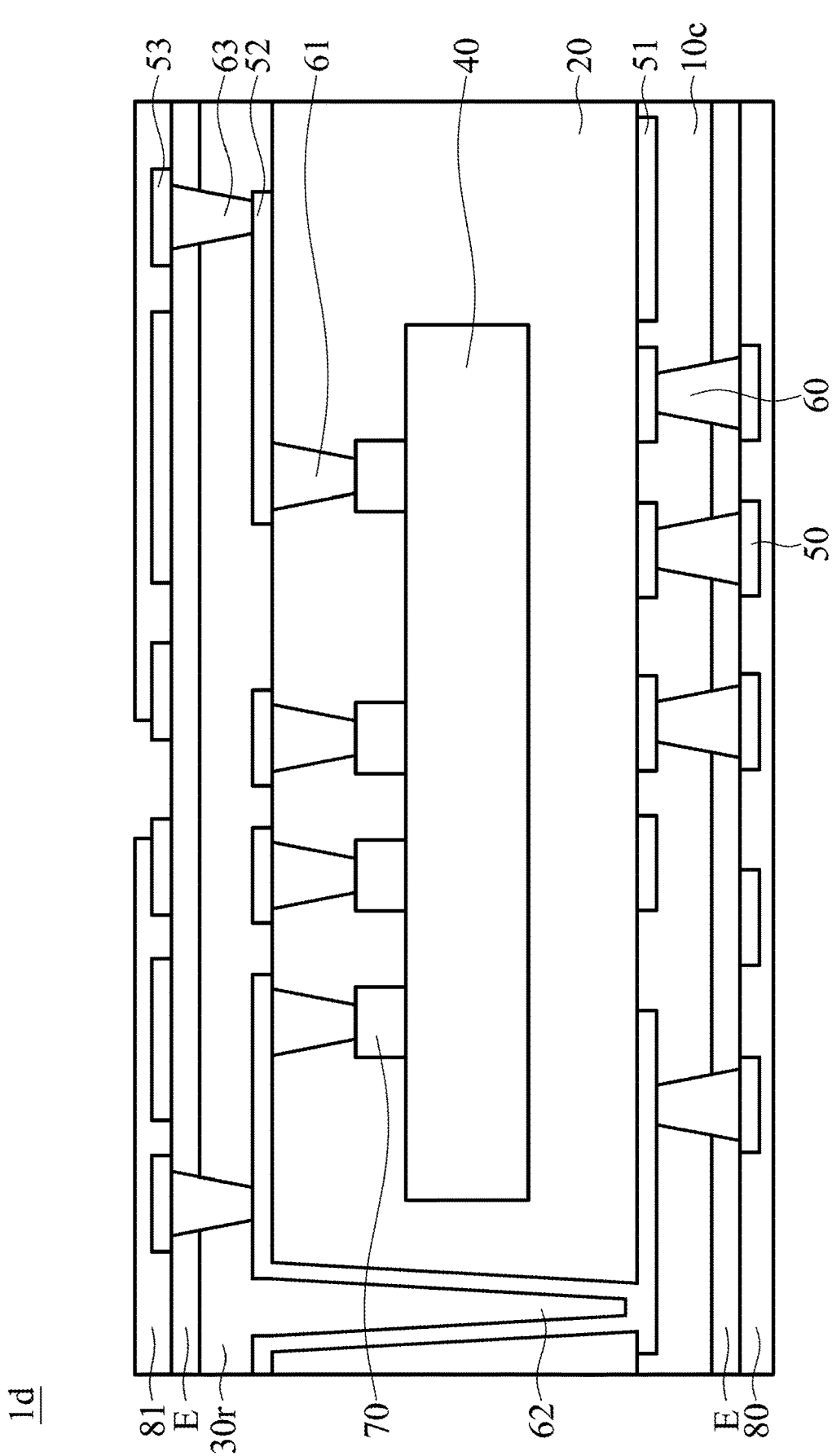
FIG. 1D is a cross-sectional view of another package structure of an embodiment of the present invention.

A package structure 1d of another embodiment of the present invention is illustrated in FIG. 1D. The structure of the package structure 1d is similar to the structure of the package structure 1b, wherein the difference is that a resilient layer E is disposed on the first insulating layer 10c and the third insulating layer 30r, and the description of other identical or similar elements are not repeated herein. The material of the resilient layer E may be, for example, a resilient material such as resin, and no glass fiber is required. Furthermore, the resilient layer E may be glued with the first insulating layer 10c. As a result, even if the first insulating layer 10c faces impact and being crushed, the resilient layer E can be glued with the crashed first insulating layer 10c to prevent the fragments of the first insulating layer 10c from being scattered and damaging the device.

Figure 1E:
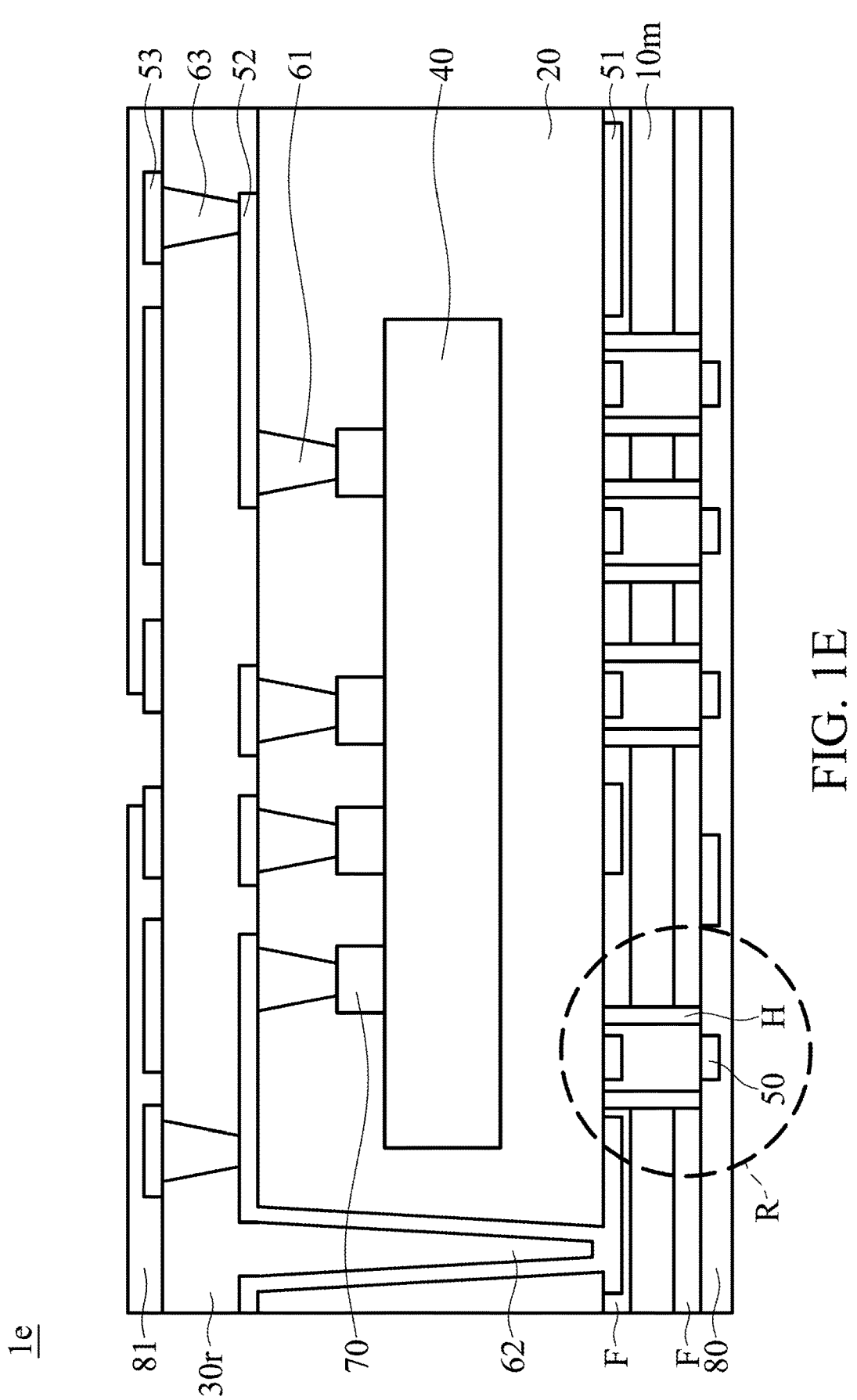
FIG. 1E is a cross-sectional view of another package structure of an embodiment of the present invention.

A package structure 1e of another embodiment of the present invention is illustrated in FIG. 1E. The structure of the package structure 1e is similar to the structure of the package structure 1a, and the difference between them is that the first insulating layer 10r of the package structure 1a is replaced by a first insulating layer 10m having two insulating films F on both sides of the first insulating layer 10m, and the first insulating layer 10m is formed by metal (e.g. Al or Cu) in the package structure 1e, the description of other identical or similar elements are not repeated therein. The insulating film F may be formed, for example, by anodizing or other methods, to prevent short circuit between the metal of the first insulating layer 10m and other conductive structures (such as the interconnection structure) when contacting with the conductive structures.

Because the first insulating layer 10m is formed by a material having higher heat conductivity than the material of the first insulating layer 10c, the heat generated by the elements in the package structure 1e when operating may be further dissipated. As a result, advantages such as preventing the temperature from being too high, controlling heat transfer direction and enhancing the performance may be achieved. Furthermore, the extensibility and the hardness of the first insulating layer 10m made of metal is higher than the insulating layer 20 made of resin, so the first insulating layer 10m may improve the impact resistance of the elements which contacts the first insulating layer 10m. Moreover, the thickness of the first insulating layer 10m may be lower than 0.1 μm, so the package structure 1e may be further miniaturized.

Figure 1F:
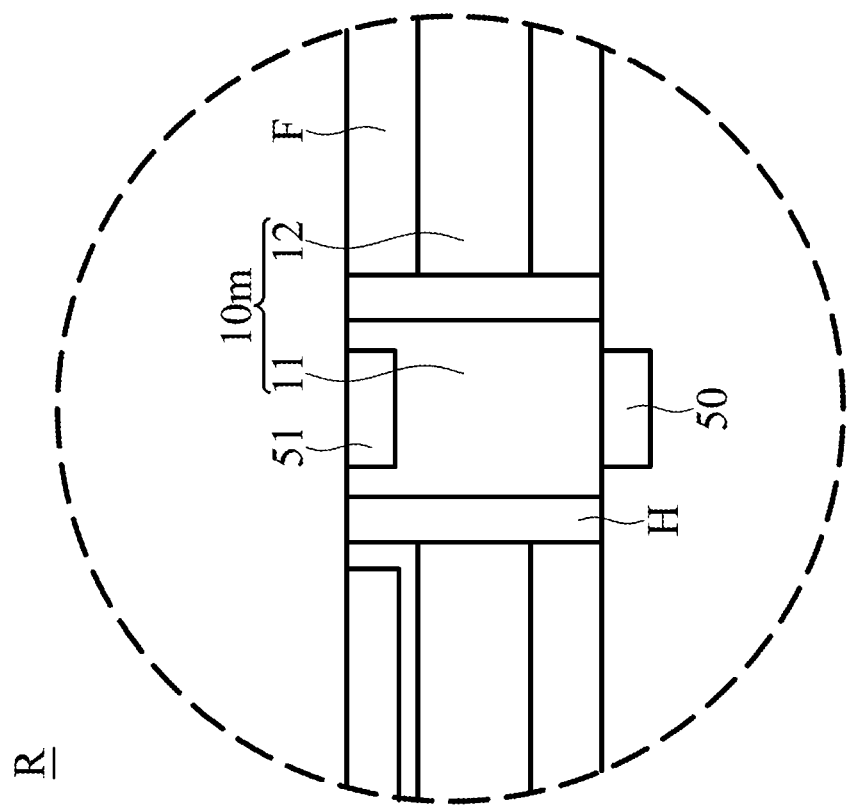
FIG. 1F is an enlarged view of the region R in FIG. 1E.

The first insulating layer 10m is formed by metal having insulating films F, so the first insulating layer 10m requires a special structure to allow electrical conduction between its upper and lower sides. Referring to FIG. 1F, which is an enlarged view of a region R in FIG. 1E, the first insulating layer 10m made of metal includes a conductive portion 11 and an insulating portion 12, and the conductive portion 11 and the insulating portion 12 are separated by an isolated portion H. In this embodiment, no insulating film F is disposed between the two isolated portions H, wherein the conductive portion 11 is directly and electrically connected to the wiring layer 51 above the conductive layer 11 and to the wiring layer 50 below the conductive portion 11, and the insulating portion 12 is not in direct contact with the wiring layer 51 above the conductive layer 11 or the wiring layer 50 below the conductive portion 11. In the isolated portion H, no element is required to be disposed therein (i.e. filled by air), or suitable insulating material may be disposed therein to prevent any interference or short circuit from occurring between the conductive portion 11 and the insulating portion 12. In other words, the conductive portion 11 is locally electrically isolated. Furthermore, the conductive portion 11 and the wiring layer 51 may be formed by different materials for facilitating processing and increasing electrical conductivity.

Figure 1G:
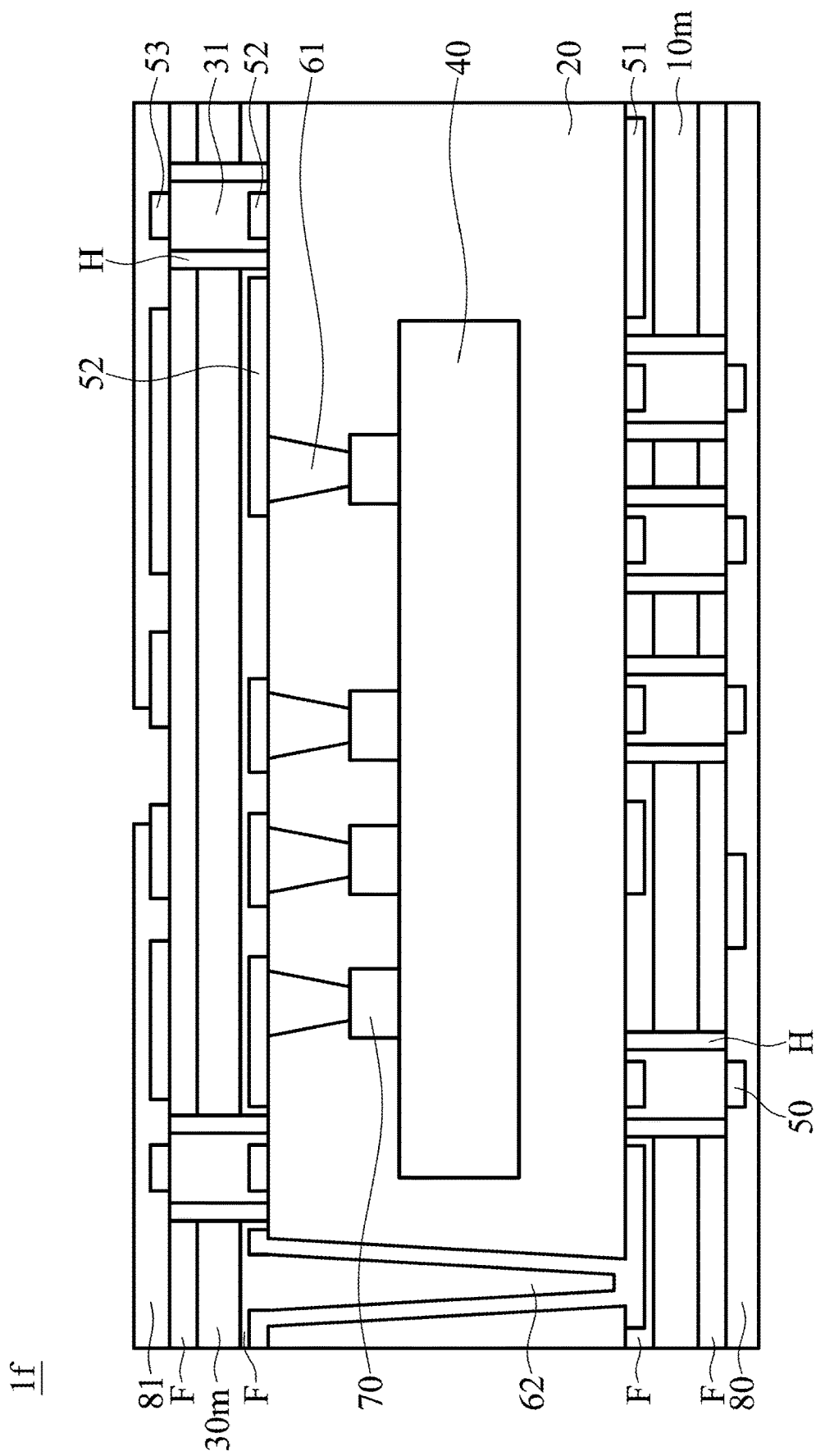
FIG. 1G is a cross-sectional view of another package structure of an embodiment of the present invention.

A package structure 1f of another embodiment of the present invention is illustrated in FIG. 1G. The structure of the package structure 1f is similar to the structure of the package structure 1a, and the difference between them is that the first insulating layer 10m and the third insulating layer 30m of the package structure 1f are made of metal materials (e.g. Al or Cu).

Both of the first insulating layer 10m and the third insulating layer 30m have insulating films F thereon to prevent short circuit occurring between the metal materials therein and other conductive structures (e.g. the interconnection structure) at their contacting place. Insulating films F may be disposed on the upper surface and lower surface of the first insulating layer 10m and on the upper surface and lower surface of the third insulating layer 30m to ensure insulation on various directions. Using metal materials having high heat conductivity allows the heat dissipation ability of the package structure 1f to be enhanced further and to prevent the temperature from being too high, thereby enhancing the efficiency of the package structure 1f. Furthermore, the first insulating layer 10m and the third insulating layer 30m made of metal are respectively disposed on the upper side and the lower side of the package structure 1f, magnetic interference from outside of the package structure 1f may be prevented to make the operation become more accurate, and no additional metal is required to be plated on the package structure 1f for reducing the magnetic interference.

Figure 1H:
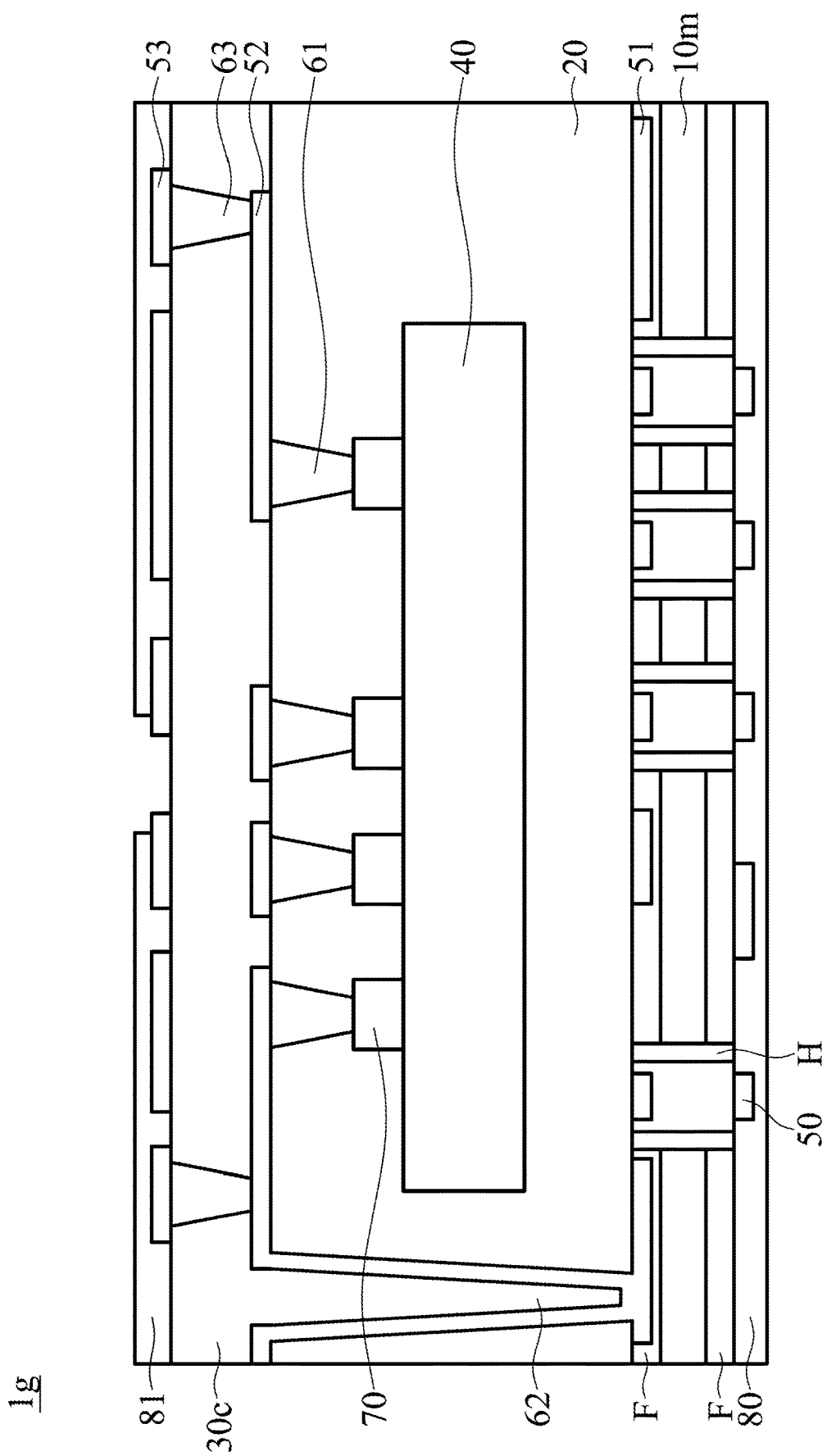
FIG. 1H is a cross-sectional view of another package structure of an embodiment of the present invention.

A package structure 1g of another embodiment of the present invention is illustrated in FIG. 1H. The difference between this embodiment and the embodiments described above is that a combination of a first insulating layer 10m made of metal and a third insulating layer 30c made of ceramic is applied in this embodiment. Both the first insulating layer 10m made of metal and the third insulating layer 30c made of ceramic have better heat conductivity than resin, so the heat generated by the package structure 1g during operation may be dissipated to prevent the temperature of the package structure 1g from becoming too high, and its performance may therefore be improved. Furthermore, the third insulating layer 30c made of ceramic requires less space, so this structure may be used in a place with a high requirement to dimensions, to achieve both miniaturization and heat dissipation.

Figure 1I:
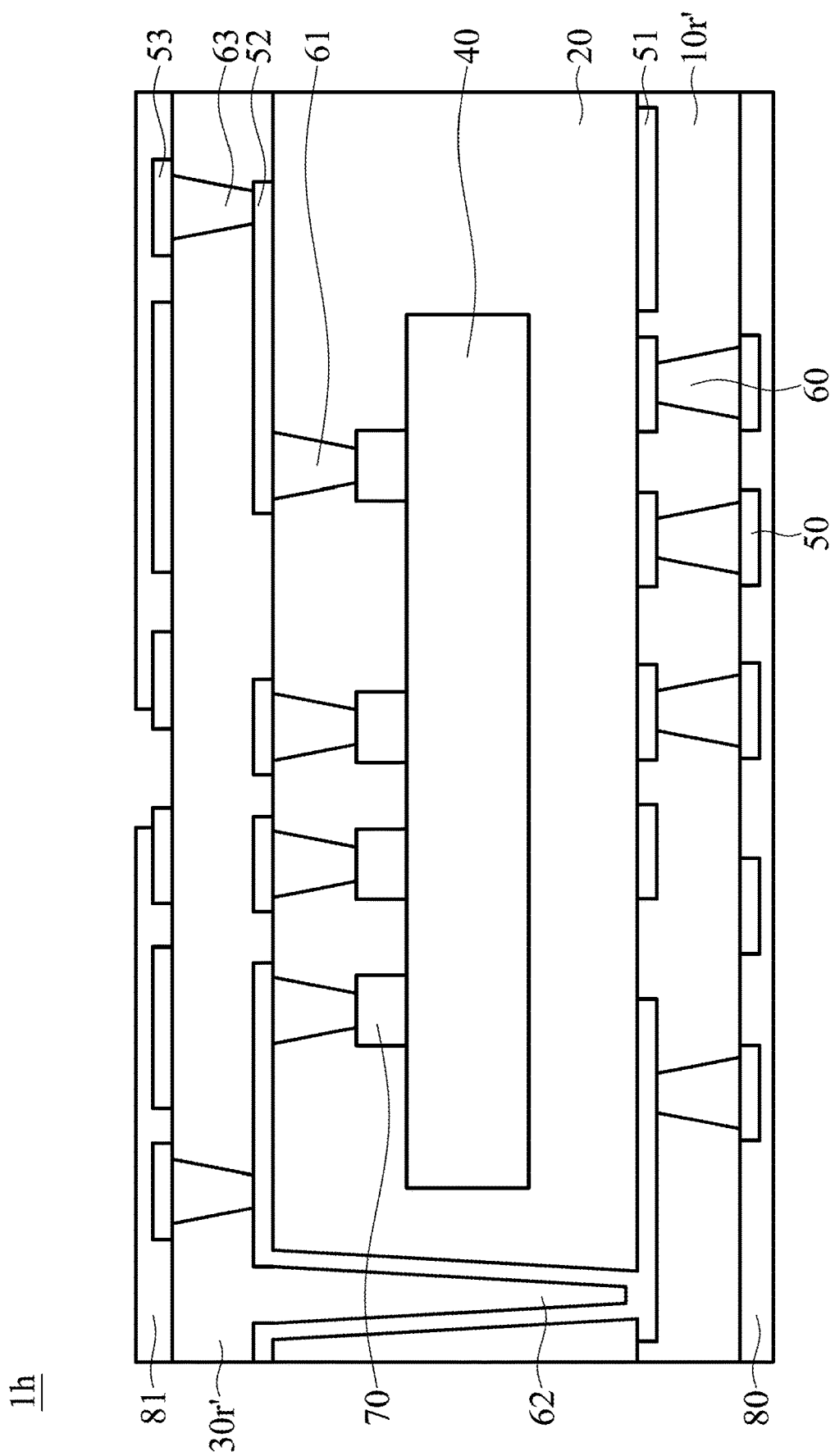
FIG. 1I is a cross-sectional view of another package structure of an embodiment of the present invention.

A package structure 1h of another embodiment of the present invention is illustrated in FIG. 1I. In this embodiment, the first insulating layer 10r' and the third insulating layer 30r' are made of resin blended with small amount of conductive materials. For example, conductive materials such as aluminum oxide, aluminum nitride, gold powder, silver powder and graphite may be blended into the resin material to increasing the heat conductivity, wherein the first insulating layer 10r' and the third insulating layer 30r' are still keeping electrical insulating. As a result, the heat dissipation rate of the package structure 1h may be increased, and higher performance may be achieved.

Figure 1J:
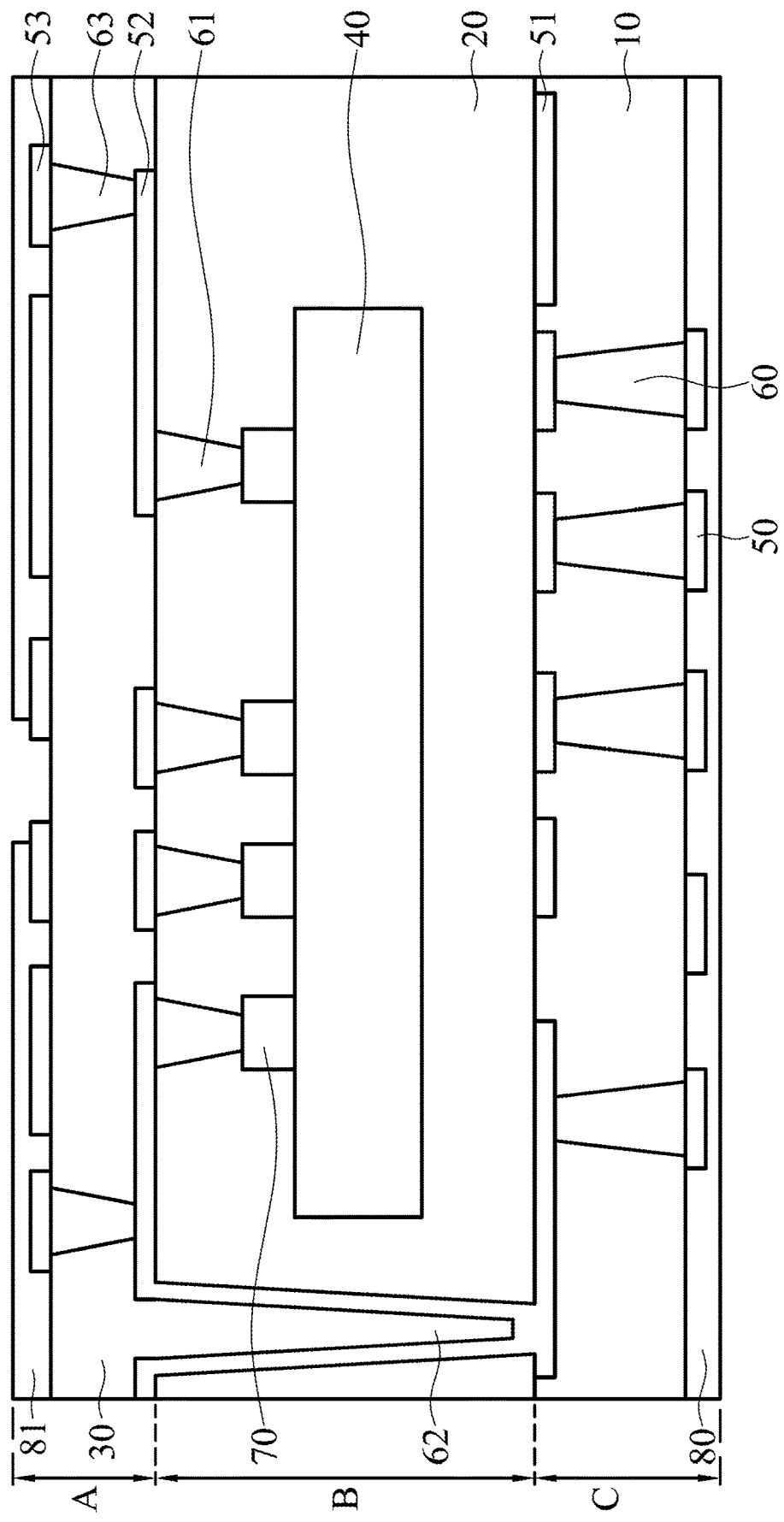
FIG. 1J is a cross-sectional view of another package structure of an embodiment of the present invention.

A package structure 1i of another embodiment of the present invention is illustrated in FIG. 1J. The difference between this embodiment and the previous embodiments is that the thicknesses of the insulating layers of the package structure 1i are different. As shown in FIG. 1J, the thickness of the third insulating layer 30 plus the passivation layer 81 (upper insulating layer) is A, the second insulating layer 20 has a thickness B, and the thickness of the first insulating layer 10 plus the passivation layer 80 (lower insulating layer) is C, wherein B>C>A. Because the upper insulating layer only requires providing electrical isolation with passive elements or environment outside, the thickness of the upper insulating layer may be reduced to achieve miniaturization. Because the lower insulating layer is required to be connected to a circuit board and to withstand impact, better protection may be achieved if the thickness C of the lower insulating layer is greater than the thickness A of the upper insulating layer. Resin and various elements (e.g. the chip 40 or other IC elements) are disposed in the second insulating layer 20, so the thickness B is designed to be greater than the thicknesses A and C.

In some embodiments, suitable materials may be chosen to allow the heat conductivity of the first insulating layer being lower than the heat conductivity of the third insulating layer, and allow the hardness of the first insulating layer being lower than the hardness of the third insulating layer. As a result, design flexibility may be increased to satisfy a variety of requirements.

Figure 2A:
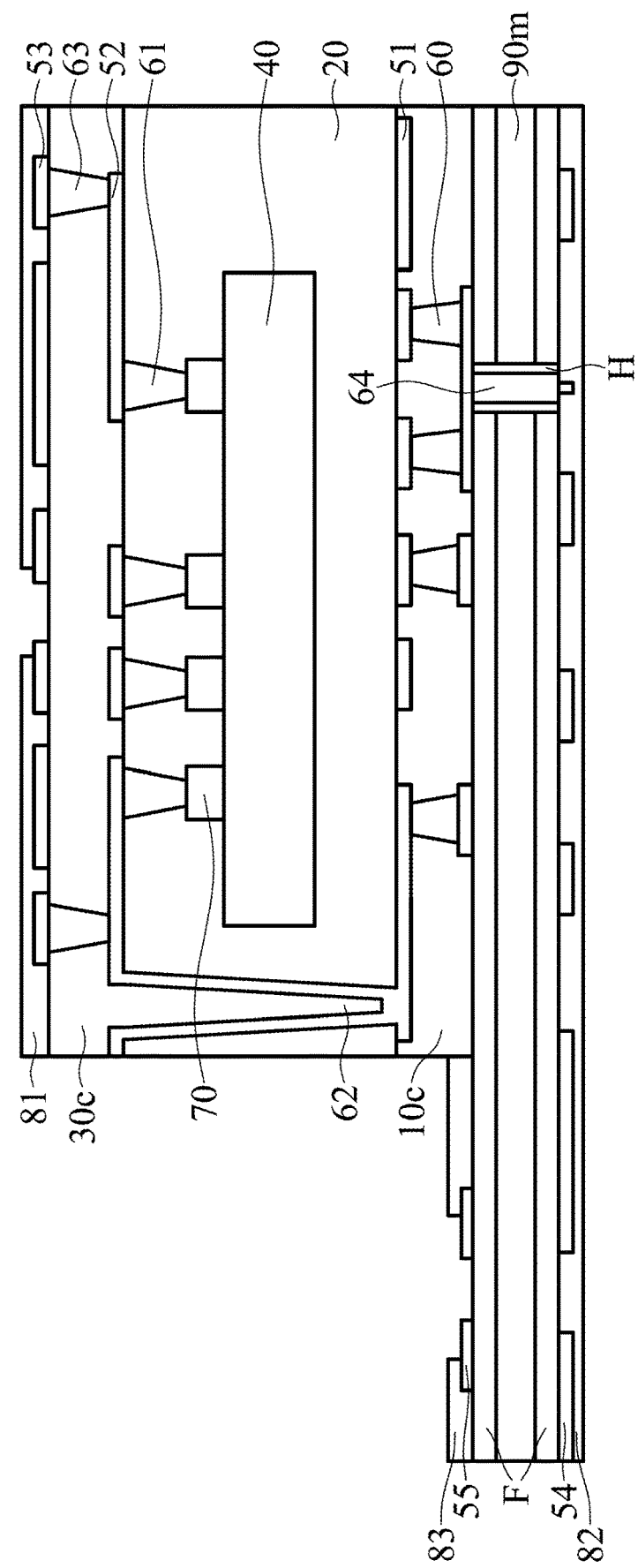
FIG. 2A is a cross-sectional view of another package structure of an embodiment of the present invention.

A package structure 2a of another embodiment of the present invention is illustrated in FIG. 2A. The package structure 2a is similar to the package structure 1c, and the difference is that an additional insulating layer 90m is disposed on the first insulating layer 10c of the package structure 2a. The insulating layer 90m may be formed by identical or similar metal materials to the first insulating layer 10m and the third insulating layer 30m of the above-mentioned embodiments, and insulating films F may be disposed on the insulating layer 90m to prevent short circuit from occurring between the metal material of the insulating layer 90m and other elements. Wiring layers 54 and 55 may be disposed on two sides of the insulating layer 90m for connecting with circuits outside, and passivation layers 82 and 83 may be disposed on the wiring layers 54 and 55, respectively. Materials, processes, and usages of the passivation layers 82 and 83 are similar to materials, processes, and usages of the passivation layers 80 and 81, and are not repeated therein. A via 64 is disposed in the insulating layer 90m to provide electrical connection between the wiring layers 54 and 55.

The width of the insulating layer 90m is greater than the first insulating layer 10c and the third insulating layer 30c in FIG. 2A, so additional elements (e.g. other passive elements) may be disposed on the insulating layer 90m to use the space in a more efficient manner. Furthermore, the flatness of the insulating layer 90m made of metal is easier to be controlled, so providing the insulating layer 90m in the package structure 2a may allow the package structure 2a achieving a better flatness. Moreover, the additional insulating layer 90m having high heat conductivity is provided, so the heat dissipation efficiency may be further improved.

Figure 2B:
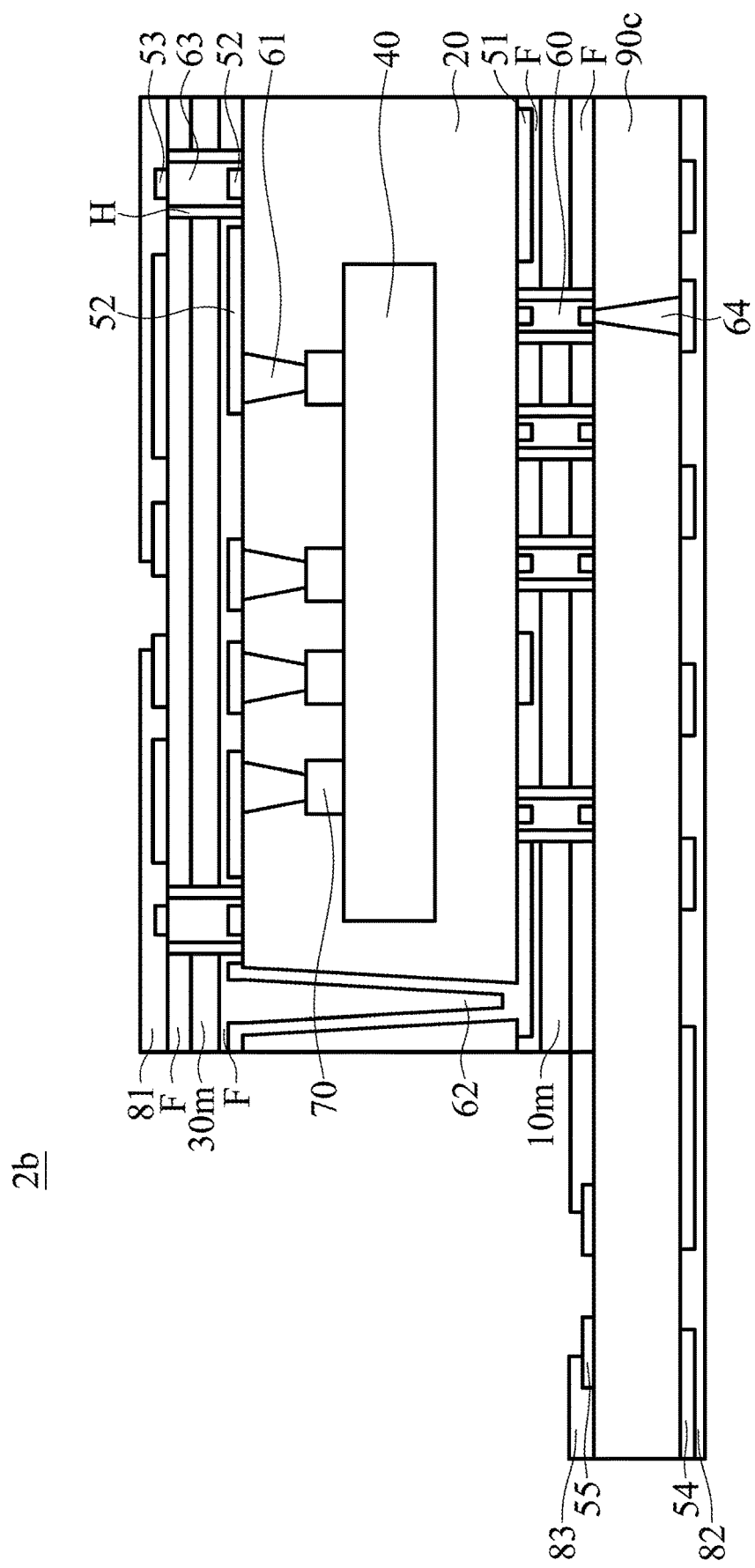
FIG. 2B is a cross-sectional view of another package structure of an embodiment of the present invention.

A package structure 2b of another embodiment of the present invention is illustrated in FIG. 2B. The difference between the package structures 2a and 2b is that the package structure 2b includes a first insulating layer 10m and a third insulating layer 30m made of metal and an insulating layer 90c made of ceramic, and the description of other identical or similar elements are not repeated therein. Using the insulating layer 90c with a greater width than the width of the first insulating layer 10m and the third insulating layer 30m in the package structure 2b may improve heat dissipation of the package structure 2b. Furthermore, additional elements (e.g. passive elements) may be disposed on the insulating layer 90c to utilize the space more efficiently.

Figure 3A:
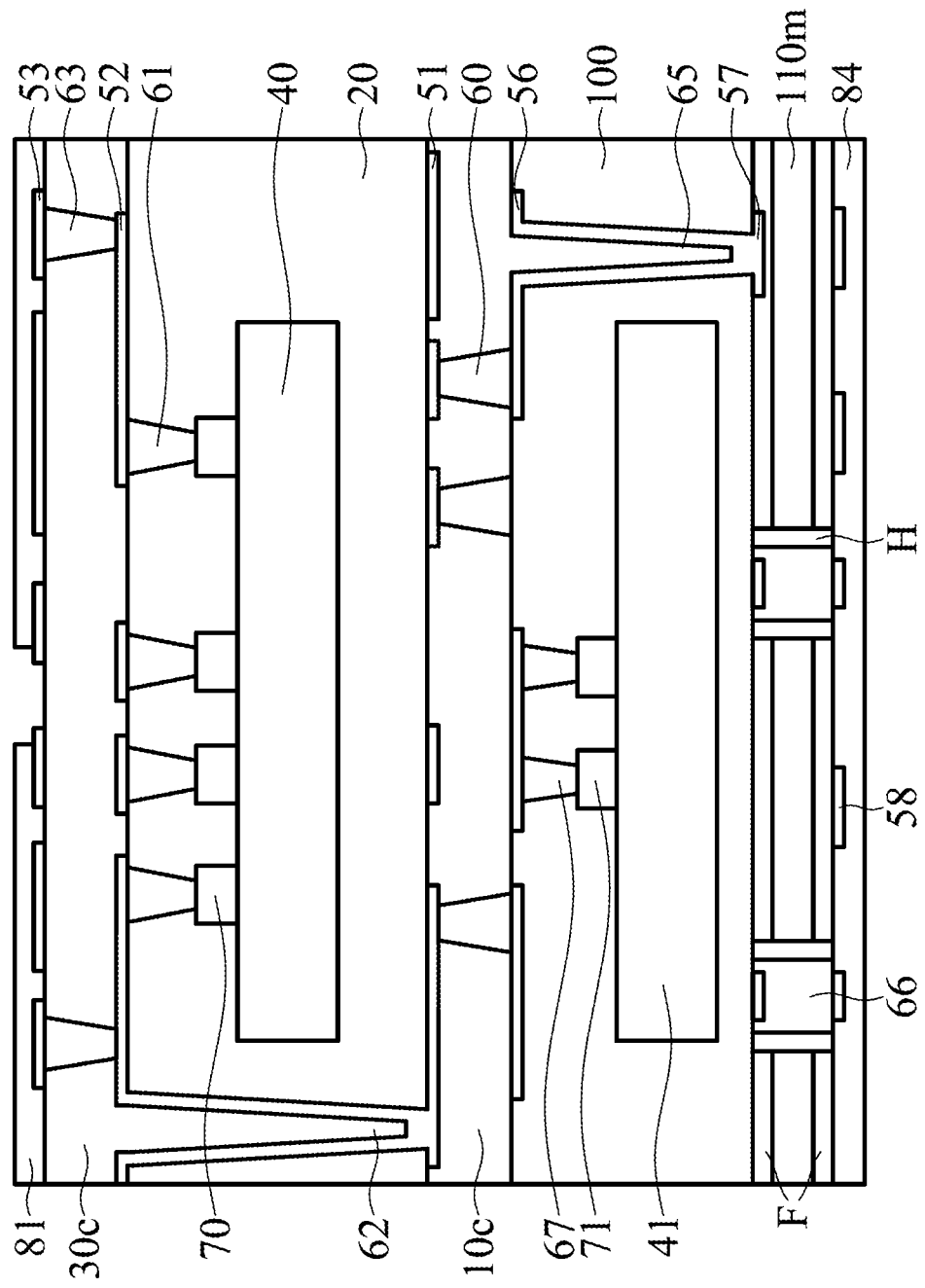
FIG. 3A is a cross-sectional view of another package structure of an embodiment of the present invention.

A package structure 3a of another embodiment of the present invention is illustrated in FIG. 3A. In this embodiment, the difference between the package structures 3a and 1c is that another package structure including an insulating layer 100 (which is similar to the second insulating layer 20) and an insulating layer 110m made of metal may be disposed on the first insulating layer 10c of the package structure 3a. Insulating films F may be disposed on the insulating layer 110m, which are similar to that of the first insulating layer 10m and the third insulating layer 30m to prevent short circuit occurring when the metal in the insulating layer 110m being contacted with other elements.

Wiring layers 56 and 57 are respectively disposed on the two sides of the insulating layer 100 in FIG. 3A, wherein the wiring layer 56 is disposed between the insulating layer 100 and the first insulating layer 10c and is electrically connected with the vias 60, and the wiring layer 57 is disposed between the insulating layers 100 and 110m. A wiring layer 58 is disposed on a surface of the insulating layer 110m opposite from a surface facing the insulating layer 100, and a passivation layer 84 is disposed on the wiring layer 58. Furthermore, a chip 41 is disposed in the insulating layer 100 and is electrically connected to the wiring layer 56 through conductive pads 71 and vias 67. The wiring layer 56 is electrically connected to the wiring layer 57 through vias 65 disposed in the insulating layer 100, the wiring layer 57 is electrically connected to the wiring layer 58 through vias 66 disposed in the insulating layer 110m, and the wiring layer 58 is electrically connected to circuits outside.

It is allowed to provide multilayered of elements in one package structure by using the package structure 3a, so the efficiency of space utilization may be enhanced to achieve mechanism miniaturization and increase the freedom of design of IC packaging. Furthermore, the first insulating layer 10c and the third insulating layer 30c made of ceramic and the insulating layer 110m made of metal have higher heat conductivity than conventional resin material and are applied in the package structure 3a, so the heat generated by the elements in the package structure 3a during operation may be dissipated faster. As a result, the temperature of the package structure 3a may be prevented from becoming too high, and the performance of the package structure 3a may be increased as well.

Figure 3B:
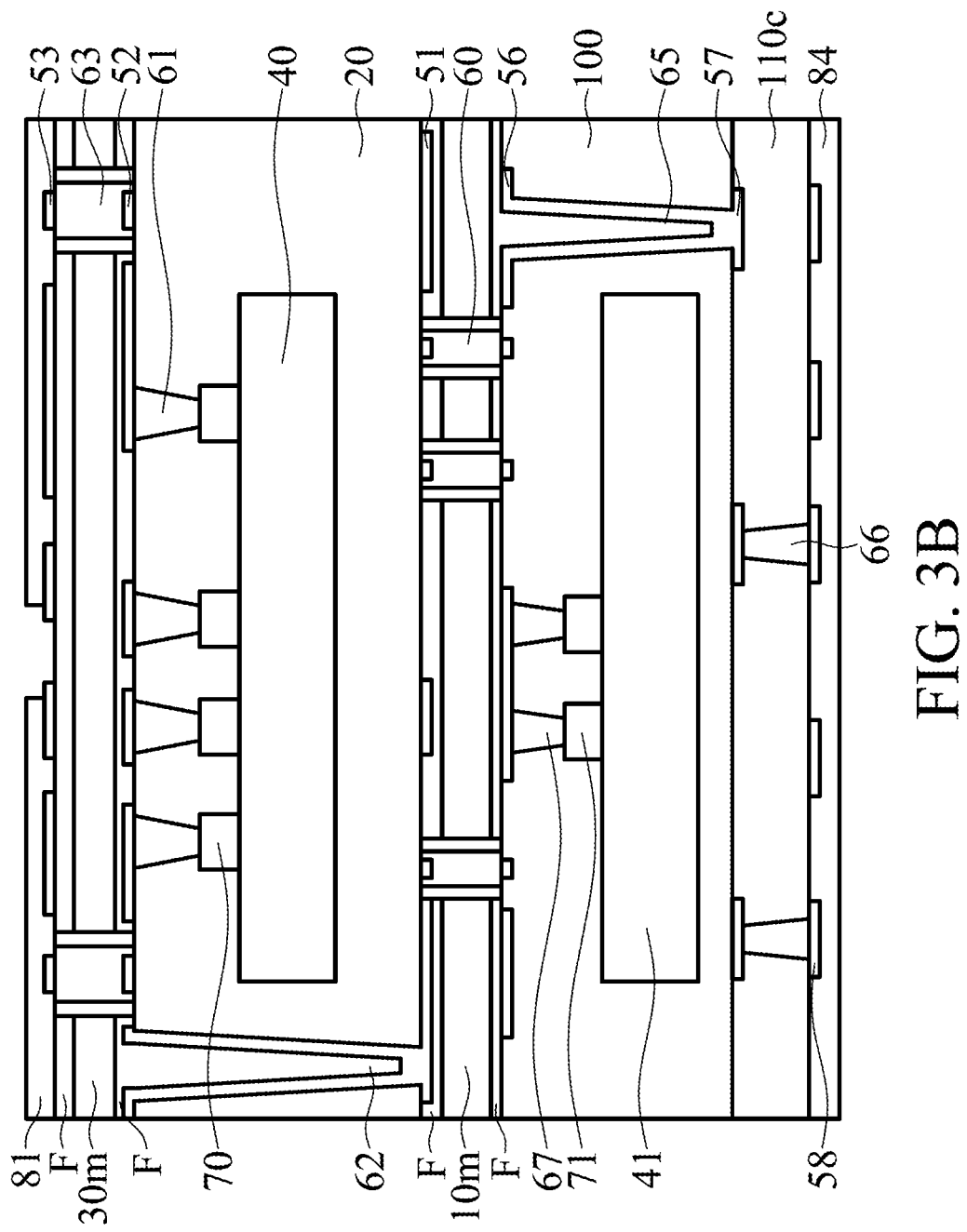
FIG. 3B is a cross-sectional view of another package structure of an embodiment of the present invention.

Although the first insulating layer 10c and the third insulating layer 30c made of ceramic and the insulating layer 110m made of metal are provided in the package structure 3a of the embodiment shown in FIG. 3A, the present invention is not limited thereto. The materials of these elements may be altered based on requirements. For example, a package structure 3b of another embodiment of the present invention is illustrated in FIG. 3B. In this embodiment, a first insulating layer 10m and a third insulating layer 30m made of metal and an insulating layer 110c made of ceramic are provided. This kind of structure allows increasing the heat dissipation efficiency, achieving mechanism miniaturization, and increasing the freedom of design of IC packaging.

Figure 4A:
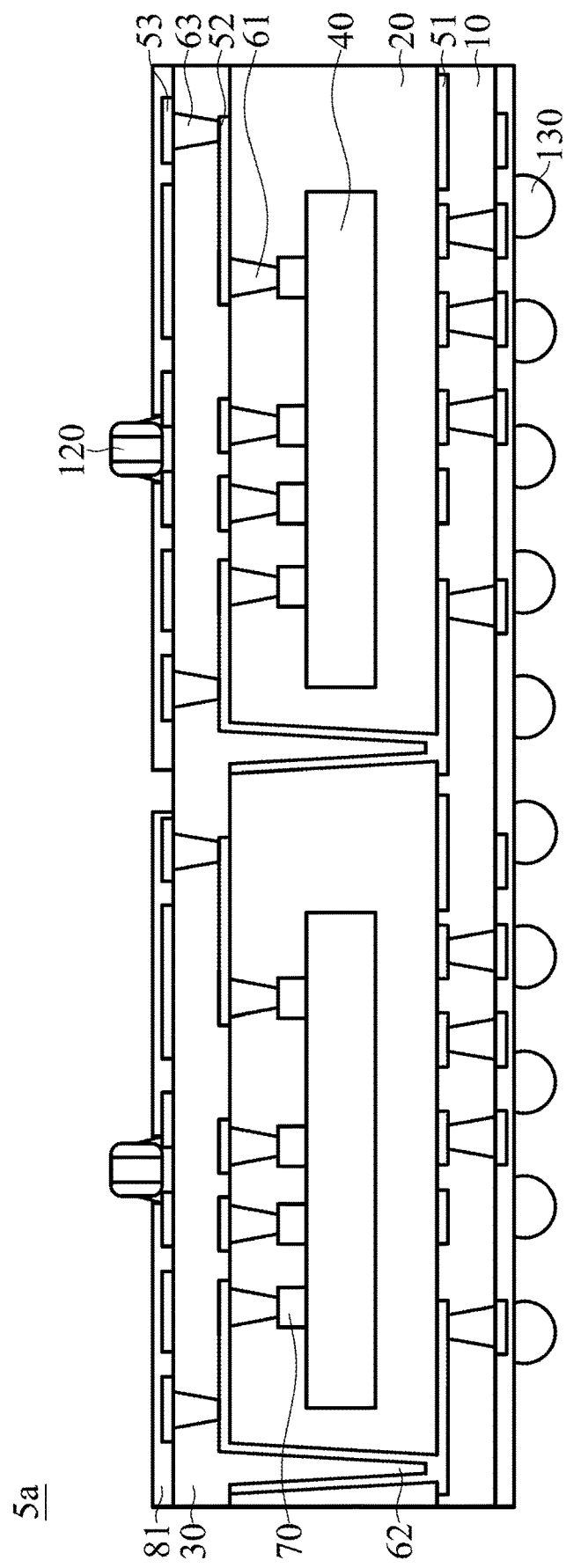
FIG. 4A is a cross-sectional view of another package structure of an embodiment of the present invention.

A package structure 5a of another embodiment of the present invention is illustrated in FIG. 4A. In the package structure 5a, the configuration and the materials of the first insulating layer 10 and the third insulating layer 30 may be identical or similar to the configuration and the materials of the first insulating layers 10c, 10m and the third insulating layers 30c, 30m. In this embodiment, multiple chips 40 may be disposed horizontally in the package structure 5a, and electronic elements 120 (e.g. passive elements) may be disposed on the package structure 5a. Furthermore, soldering balls 130 may be disposed on another surface of the package structure 5a to allow the package structure 5a to be soldered with other elements outside. The first insulating layer 10 and the third insulating layer 30 having better mechanical strength and flatness are used, so the accuracy of the process may not be influenced even if multiple chips are embedded in the second insulating layer 20. Furthermore, the connection between the layers may be increased to enhance the integrity of the whole structure.

Figure 4B:
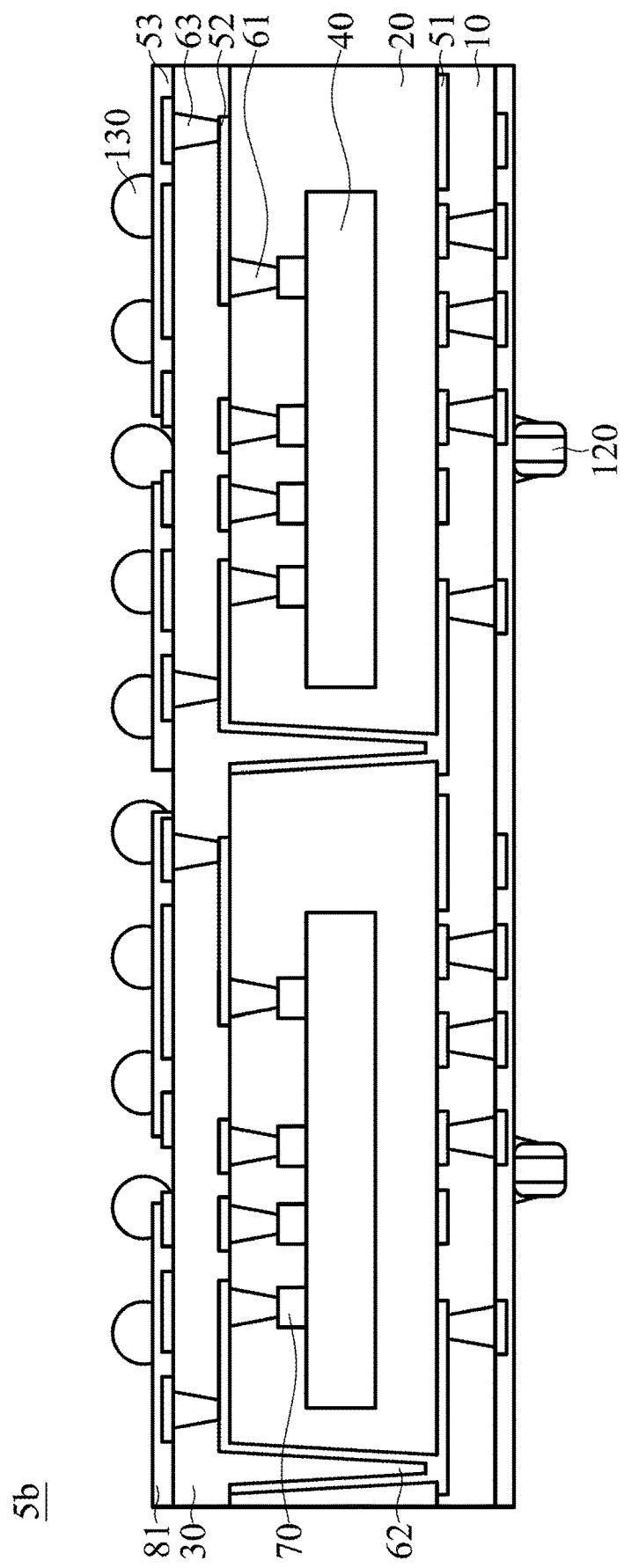
FIG. 4B is a cross-sectional view of another package structure of an embodiment of the present invention.

However, the present invention is not limited thereto. For example, passive elements may be disposed on different directions or positions, depending on design requirements, and the structure of the package structure may be altered as well. For example, referring to FIG. 4B, a package structure 5b of another embodiment of the present invention is illustrated herein. The difference between FIG. 4B and FIG. 4A is that the electronic elements 120 are disposed below the package structure 5b, and the soldering balls 130 are disposed on another side of the package structure 5b to increase the freedom of design.

The chips 40 are illustrated above as being disposed at the same height, but the present invention is not limited thereto. In FIG. 4A or 4B, the chip 40 at the left side may have a different horizontal position than the chip 40 at the right side, which increases the freedom of design.

In summary, a package structure is provided in the present invention. The package structure includes a first insulating layer, a second insulating layer and a third insulating layer, wherein the second insulating layer is disposed between the first insulating layer and the third insulating layers. The heat conductivity and the hardness of the second insulating layer are lower than heat conductivity and the hardness of the first insulating layer and/or the third insulating layer. In this configuration, the heat generated by the elements of the package structure during operation may be dissipated more efficiently, thereby preventing the temperature of the package structure from getting too high. Furthermore, the structural strength of the package structure may be improved as well to increase durability.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first insulating layer;

a second insulating layer disposed on the first insulating layer;

a chip disposed in the second insulating layer;

a third insulating layer disposed on the second insulating layer; and a first conductive structure disposed in the second insulating layer and having a shrinking shape;

a second conductive structure disposed in the second insulating layer and having a shrinking shape;

wherein the first conductive structure and the second conductive structure only shrink in an identical direction, when viewed in a direction that is parallel to an interface between the first insulating layer and the second insulating layer, the first conductive structure does not overlap the chip, and at least a portion of the second conductive structure overlaps the chip;

wherein a heat conductivity of the second insulating layer is lower than a heat conductivity of the first insulating layer, and a hardness of the second insulating layer is lower than a hardness of the first insulating layer, wherein the chip has a first surface facing the first insulating layer and a second surface facing the third insulating layer, the second insulating layer comprises a first portion and a second portion, the first portion is positioned between the first surface and the first insulating layer, and the second portion is positioned between the second surface and the third insulating layer, wherein the first insulating layer, the first surface and the first portion at least partially overlap with each other when viewed in a direction that is perpendicular to the first surface, and the third insulating layer, the second surface and the second portion at least partially overlap with each other when viewed in a direction that is perpendicular to the second surface.

2. The package structure as claimed in claim 1, wherein a material of the first insulating layer comprises ceramic, and a material of the second insulating layer comprises resin.

3. The package structure as claimed in claim 2, wherein the material of the second insulating layer does not comprise glass fiber.

4. The package structure as claimed in claim 2, wherein a material of the third insulating layer comprises ceramic.

5. The package structure as claimed in claim 2, wherein the third insulating layer comprises a metal layer and an insulating film disposed on the metal layer.

6. The package structure as claimed in claim 2, further comprising a resilient layer disposed on the first insulating layer.

7. The package structure as claimed in claim 6, further comprising an electronic element disposed on the first insulating layer.

8. The package structure as claimed in claim 2, wherein the heat conductivity of the first insulating layer is lower than the heat conductivity of the third insulating layer, and the hardness of the first insulating layer is lower than a hardness of the third insulating layer.

9. The package structure as claimed in claim 2, wherein a thickness of a ceramic material in the first insulating layer is greater than 50% of a thickness of the first insulating layer.

10. The package structure as claimed in claim 1, wherein a thickness of the second insulating layer is greater than a thickness of the first insulating layer and a thickness of the third insulating layer.

11. The package structure as claimed in claim 10, wherein the thickness of the third insulating layer is greater than the thickness of the first insulating layer.

12. The package structure as claimed in claim 1, wherein the first insulating layer comprises a metal layer and an insulating film disposed on the metal layer, and the second insulating layer comprises resin.

13. The package structure as claimed in claim 12, wherein the third insulating layer comprises ceramic.

14. The package structure as claimed in claim 12, wherein the third insulating layer comprises a metal layer and a second insulating film.

15. The package structure as claimed in claim 12, wherein the metal layer of the first insulating layer comprises a conductive portion and an insulating portion electrically isolated from the conductive portion.

16. The package structure as claimed in claim 1, wherein the second insulating layer does not overlap the first insulating layer or the third insulating layer when viewed from a direction parallel to the first surface.

17. The package structure as claimed in claim 1, further comprising a first wiring layer, and a second wiring layer, wherein the first wiring layer is disposed between the first insulating layer and the second insulating layer, the second wiring layer is disposed between the second insulating layer and the third insulating layer, and the first conductive structure is electrically connected to the chip, the first wiring layer and the second wiring layer.

18. The package structure as claimed in claim 1, further comprises a wiring layer electrically connected to the chip, and the first conductive structure is in direct contact with the wiring layer.

19. The package structure as claimed in claim 1, further comprising two first straight lines, wherein one of the first straight lines comprises a first end and a second end, another one of the first straight lines comprises a third end and a fourth end, the first end and the third end are connected through a second straight line, and the second end and the fourth end are connected through a third straight line, wherein a shortest distance between the third straight line and the chip is less than a shortest distance between the second straight line and the chip, and a length of the third straight line is less than a length of the second straight line.

* * * * *